United States Patent
Brannen et al.

(10) Patent No.: US 6,717,783 B2
(45) Date of Patent: Apr. 6, 2004

(54) SHORT CIRCUIT POWER LIMITER

(75) Inventors: Robert Alan Brannen, Fremont, CA (US); Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 402 days.

(21) Appl. No.: 09/757,987

(22) Filed: Jan. 9, 2001

(65) Prior Publication Data

US 2002/0089801 A1 Jul. 11, 2002

(51) Int. Cl.[7] .................................................. H02H 9/00
(52) U.S. Cl. .................. 361/58; 361/93.1; 361/93.9; 361/94; 361/100; 361/101
(58) Field of Search ....................... 361/58, 93.1, 93.9, 361/94, 100, 101

(56) References Cited

U.S. PATENT DOCUMENTS 6,469,575 B1 * 10/2002 Oki et al. ..................... 330/10

* cited by examiner

*Primary Examiner*—Gregory J. Toatley, Jr.
*Assistant Examiner*—Isabel Rodriguez
(74) *Attorney, Agent, or Firm*—Townsend and Townsend and Crew LLP

(57) ABSTRACT

The present invention provides a short circuit power limiter circuit having a current sensor and a power limiter. The short circuit sensor sends a short circuit flag signal to the power limiter when the short circuit sensor detects a short circuit condition in a target circuit. The power limiter then reduces the power consumption of the target circuit. In a specific example, the power limiter toggles a particular portion of the target circuit on and off to reduce the circuit's average short circuit power consumption. This cycle is repeated as long as a short circuit condition exists.

17 Claims, 5 Drawing Sheets

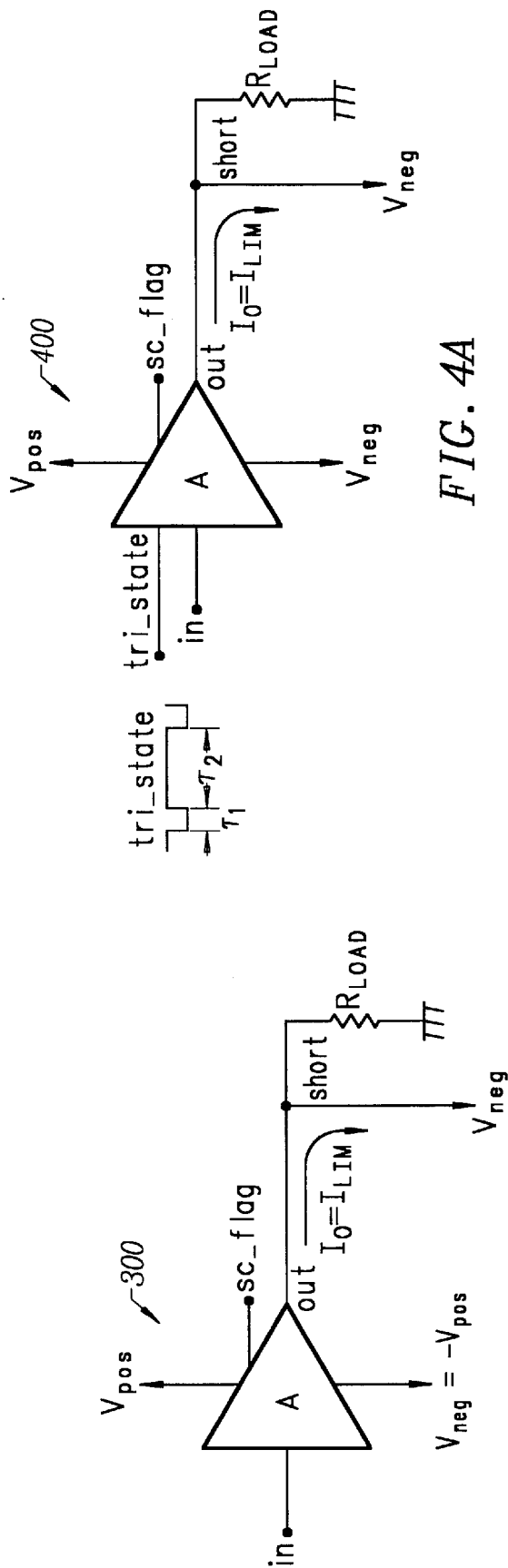
*FIG. 4A*
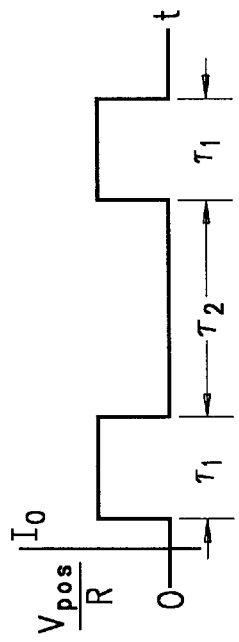
*FIG. 4B*
*FIG. 3*

SHORT CIRCUIT POWER LIMITER

BACKGROUND OF THE INVENTION

The present invention relates generally to integrated circuits (ICs) and more particularly to a short circuit power limiter that limits and controls power consumption during short circuit conditions.

Short circuit current limiting has long been used to protect the output transistors during short circuit events. With amplifiers for example, if the current is not limited, excess power consumed by the output transistors could be too great resulting in permanent physical damage to the amplifier.

FIG. 1a shows a simplified high-level block diagram of a conventional amplifier, according to the prior art. Under existing current limiting schemes, the average power consumed by an amplifier is at its maximum value during a short circuit event. To withstand this maximum value, the amplifier must be sufficiently robust. Conventional ways to make it robust include oversized on-chip metal routing and die size, special IC packaging, and external heat sinks. Each of these solutions, however, increases the overall system cost.

SUMMARY OF THE INVENTION

The present invention provides a short circuit power limiter which limits power consumption during a current-limited short circuit event. When a short circuit sensor detects a short circuit condition in a target circuit, the sensor sends a short circuit flag signal to the power limiter. The power limiter then reduces the power consumption of the circuit. In a specific example, the power limiter toggles particular portions of the circuit on and off to reduce the circuit's average short circuit power consumption.

The description of the present invention uses the term short circuit "power limiting" and is distinguished from, and in addition to, existing short circuit "current limiting" schemes. The present invention provides a circuit and a method for reducing the short circuit power consumption of a circuit to, in one embodiment, a value below that of normal operation power consumption. Because the present invention reduces the worst case power consumption, it also reduces the cost of implementing circuits that might have short circuit problems, such as amplifier circuits. As a result, the present invention provides an optimal physical design that is economically feasible. In another embodiment, by periodically turning on the circuit, instead of simply turning it off, the current can be sensed to determine if the short-circuit condition is continuing or not.

In one embodiment, the short circuit power limiter circuit has an input terminal coupled to receive a short circuit flag signal from the current sensor. The current sensor is configured to couple to a target circuit, such as an output buffer of an amplifier. The power limiter is configured to send a tri-state signal to the output buffer in response to the short circuit flag signal during short circuit conditions, and also configured to assert the tri-state signal for a duration of $\tau_2$ seconds. The limiter circuit disables the output buffer for a duration of $\tau_2$ seconds and enables the output buffer for a duration of $\tau_1$ seconds, repeating such a cycle as long as a short circuit condition exists.

In another embodiment, the short circuit flag signal goes low during a short circuit event. In another embodiment, the power limiter circuit also includes a counter configured to generate the tri-state signal.

The present invention achieves the above purposes and benefits in a simple, versatile, and reliable circuit and method that is readily suited to the widest possible utilization. The present invention achieves these purposes and benefits in the context of known circuit technology and known techniques in the electronic arts. Further understanding, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

BRIEF DESCRIPTION OF THE DRAWINGS

FIG. 3 shows a simplified high-level schematic diagram of an amplifier where the amplifier is shorted to a negative voltage supply;

FIG. 4a shows a simplified high-level schematic diagram of an amplifier where the amplifier is shorted to a negative voltage supply, and the amplifier is tri-stated;

FIG. 4b shows a timing diagram illustrating the operation of the amplifier of FIG. 4a where the amplifier is toggled into and out of tri-state mode, according to an embodiment of the present invention;

DESCRIPTION OF THE SPECIFIC EMBODIMENTS

With reference to the drawings, the short circuit power limiter method and the apparatus for carrying out the method, according to the present invention, is described below.

Figure 1A:
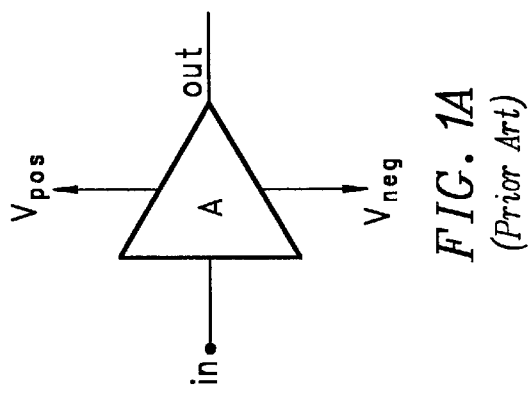
FIG. 1a shows a simplified high-level block diagram of a conventional amplifier, according to the prior art.
Figure 1B:
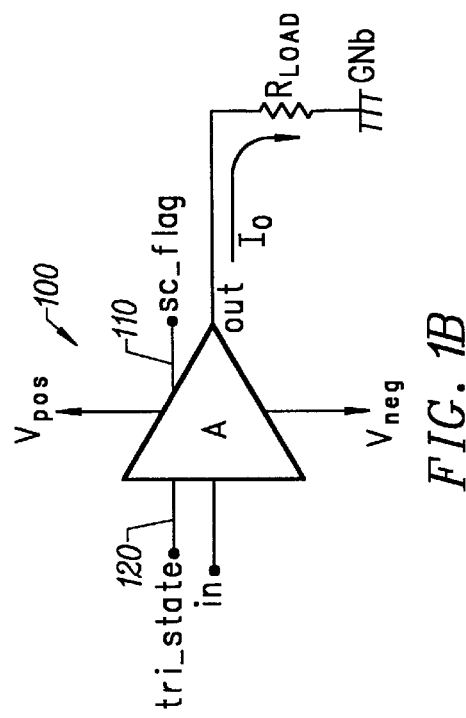
FIG. 1b shows a simplified high-level block diagram of an amplifier having a current sensor and a tri-state node, according to an embodiment of the present invention.

FIG. 1b shows a simplified high-level block diagram of an amplifier 100, current sensor node 110 and a tri-state node 120, according to an embodiment of the present invention. In this specific embodiment, a current sensor (not shown) is designed into amplifier 100. The current sensor is configured to couple between the output buffer of amplifier 100 current sensor node 110. Current sensors are well known in the art. The amplifier is powered by voltage supplies $V_{pos}$ and $V_{neg}$. The gain of the amplifier is designated by "A." An output of the amplifier couples to ground through a load resistance $R_{load}$. Amplifier 100 is limited to a maximum value $I_{lim}$. The value of $I_{lim}$ can be set using a variety of current limiting schemes, or it can simply be the maximum current inherent to the amplifier (with no current limiting protection).

In operation, when the output current $I_o$ reaches or exceeds $I_{lim}$, the current sensor outputs a digital short circuit flag signal sc_flag at current sensor node 110. Specifically, current sensor node signals by changing to a predetermined logical state (high or low). In this example, it changes to a logical high. The output buffer or transistors of amplifier 100 can be tri-stated (turned off) at any time by asserting the appropriate logical state to tri-state node 120. In this example, a digital input that is at a logical high tri-states the amplifier.

Figure 2:
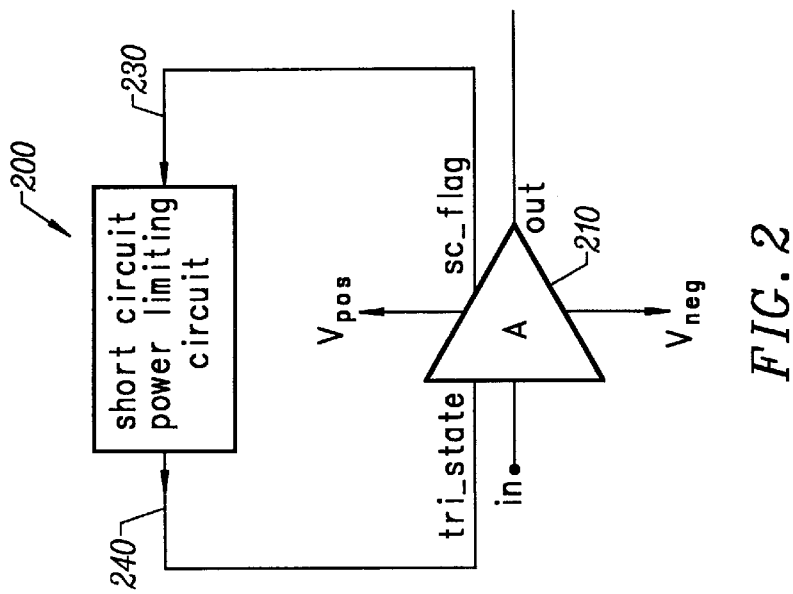
FIG. 2 shows a simplified high-level block diagram of a short circuit power limiter circuit coupled to an amplifier, according to an embodiment of the present invention.

FIG. 2 shows a simplified high-level block diagram of a short circuit power limiter circuit 200 coupled to an amplifier 210, according to an embodiment of the present invention. Amplifier 210 has the features of amplifier 100 of FIG. 1*b*. Limiting circuit 200 couples between a sensor node 230 and tri-state node 240.

In operation, when a short circuit condition occurs, a short circuit flag signal sc_flag is sent to power limiter 200. A short circuit condition is triggered when $I_o$ reaches or exceeds $I_{lim}$. While the power limiter circuit can receive a short circuit flag signal from a current sensor in an amplifier, the power limiter can itself include a current sensor. In such an embodiment, the current limiter would couple to an output buffer to sense its current level and generate a short circuit flag when a short circuit condition exists.

Still referring to FIG. 2, after limiting circuit 200 receives a short circuit flag signal sc_flag, circuit 200 outputs a tri-state signal (logical high) to amplifier 210 to turn its output transistors off. After waiting a while to allow the output transistors to "cool off", the tri-stated signal is set low, turning the output transistors on again. If the short still exists, the output transistors turn off again for another "cooling off" period. This cycle repeats indefinitely until the short circuit condition goes away.

More specifically, the output transistors turn on for $\tau_1$ seconds and cool off for $\tau_2$ seconds. The time periods $\tau_1$ and $\tau_2$ are chosen so that the average power dissipation $P_{ave}$ in the output transistors during a continuous short circuit event is less than the nominal power dissipation $P_{nom}$ of the output transistors during normal circuit operation. The specific choice of $\tau_1$ and $\tau_2$ can be tailored to specific applications and expected amplifier output signals.

The following example illustrates how $\tau_1$ and $\tau_2$ can be chosen. Referring back to FIG. 1, the amplifier drives a rail-to-rail sine wave across the grounded resistor $R_{load}$, where $V_{pos}=|V_{neg}|$. The average power consumed by the load resistor is $(V_{pos})^2/(2*R_{load})$. The average power delivered by the voltage supplies (to the load resistor and the amplifier) is $2*(V_{pos})^2/(\pi*R_{load})$. The average power consumed by the amplifier is $[2*(V_{pos})^2/(\pi* R_{load})]-[(V_{pos})^2/(2*R_{load})]$. This is equal to the average power delivered by the supplies minus the average power consumed by the load. It is desirable that this amplifier power is limited during a short circuit event.

FIG. 3 shows a simplified high-level schematic diagram of an amplifier 300 where the amplifier is shorted to a negative voltage supply $V_{neg}$. Under normal operating conditions, amplifier 300 drives a voltage sine wave that swings from positive to negative across $R_{load}$, where $V_{pos}=|V_{neg}|$. In this example, amplifier 300 is shorted to $V_{neg}$. Here, amplifier 300 is current limited to $V_{pos}/R_{load}=|V_{neg}|/R_{load}$ (the peak output current seen driving the sine wave across $R_{load}$ to ground). The power consumed by the amplifier during a current limited short circuit to either supply is $(V_{pos}-|V_{neg}|)*I_{lim}=2*(V_{pos})^2/R_{load}$.

The power dissipated by the shorted amplifier can be shown to be $4*\pi/(4-\pi)$ times greater (about 14.6 times greater) than the power of the unshorted amplifier driving the sine wave under normal operating conditions. (This is merely the power consumed by the amplifiers alone and does not include the load.) This extra power dissipation has major implications on the chip temperature and system level design for heat dissipation. It can also cause irreparable damage to the amplifier.

FIG. 4 shows a simplified high-level schematic diagram of an amplifier 400 where the amplifier is shorted to a negative voltage supply. In addition, the amplifier is tri-stated. In this specific example, the amplifier is tri-stated for $\tau_2/(\tau_1+\tau_2)$ seconds. Setting $\tau_2=13.6*\tau_1$ for this example reduces the short circuit power dissipation to that of an unshorted amp driving the sine wave, that is, down to the normal operating level. Setting $\tau_2$ slightly higher would guarantee that the worst-case average amplifier power consumption occurs during normal conditions and not during a short. This information allows for an optimal physical design. The circuit packaging and such would be made physically robust enough to withstand normal operating conditions. Thus, with proper short circuit limiting, the physical aspects of the amplifier would not have to be over-designed even further to withstand a short circuit. In general, $\tau_1$ and $\tau_2$ could be tailored to meet the requirements of any given amplifier, output waveform, and loading requirements. FIG. 4*b* shows a timing diagram illustrating the operation of the amplifier of FIG. 4*a* where the amplifier is toggled into and out of tri-state mode, according to an embodiment of the present invention.

Figure 5:
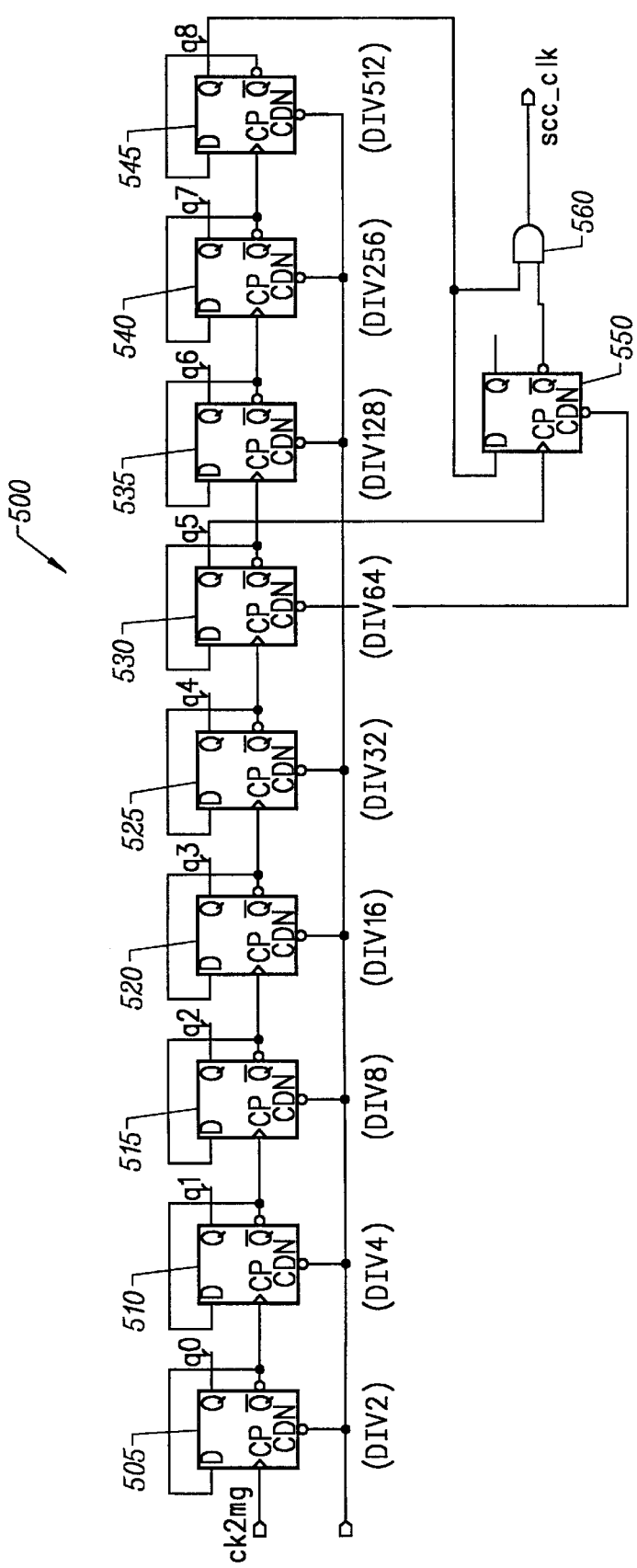
FIG. 5 shows a simplified high-level schematic diagram of a counter circuit, according to an embodiment of the present invention.

The short circuit power limiter circuit includes a counter circuit and limiter circuit. FIG. 5 shows a simplified high-level schematic diagram of a counter circuit 500, according to an embodiment of the present invention. In this specific embodiment, counter circuit 500 includes chain of registers 505–545 and a final register 550 that feeds into an AND gate 560. Generally, counter circuit 500 provides the timing for $\tau_1$ and $\tau_2$. More specifically, counter 500 generates a clock signal scc_clk which is at a logical high for $\tau_1$ seconds and at a logical low for $\tau_2$ seconds. Counters are well known in the art, and any circuit that can generate an appropriate clock signal would suffice. It is to be understood that this specific implementation as depicted and described herein for illustrative purposes only, and that alternative circuit implementations exist for the same functionality.

Figure 6:
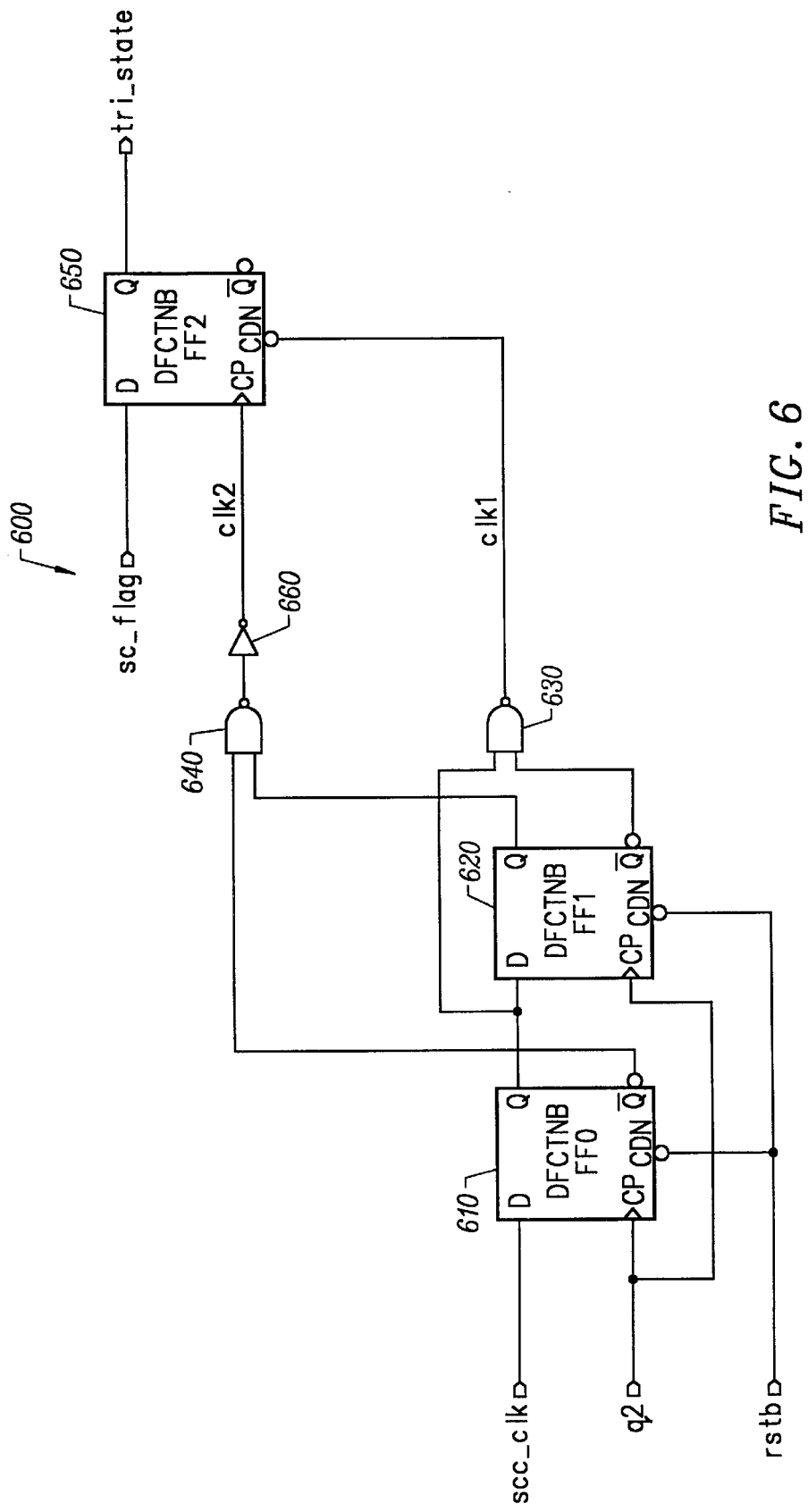
FIG. 6 shows a simplified high-level schematic diagram of a limiter circuit, according to an embodiment of the present invention.

FIG. 6 shows a simplified high-level schematic diagram of a limiter circuit 600, according to an embodiment of the present invention. Generally, limiter circuit 600 receives the short circuit flag signal sc_flag from the amplifier (not shown) if a short circuit condition occurs and sends a tri-state signal with proper timing to the amplifier. The advantage to generating clock signal scc_clk is that one counter circuit, such as that described in FIG. 5, can be used with many limiter circuits that share clock signal scc_clk as a common input.

The specific embodiment of FIG. 6 includes two registers or flip-flops 610 and 620. Here, flip-flops 610 and 620 edge detect the rising and falling edges of clock signal scc_clk by using a high frequency clock q2. An output of flip-flops 610 couples to an input of flip-flop 620 and to a first input of a NAND gate 630. A complimentary output of flip-flop 610 couples to a first input of a NAND gate 640. An output of flip-flop 620 couples to a second input of NAND gate 640, and a complimentary output of flip-flop 620 couples to a second input of NAND gate 630.

NAND gate 630 outputs a clock signal clk1 which feeds into a first input of a register or flip-flop 650. NAND gate 640 outputs a clock signal clk2 via inverter 660, and signal clk2 feeds into a second input of a register or flip-flop 650.

Flip-flop 650 sends a tri-state signal from its Q output (tri-state node) to the amplifier if a short circuit is detected. Flip-flops are well known in the art. It is to be understood that this specific implementation as depicted and described herein for illustrative purposes only, and that alternative circuit implementations exist for the same functionality.

For example, here, the output Q (tri-state node) of flip-flop 650 resets to a logical low when its CDN input is at a logical low. That input goes low when clk1 goes low. Flip-flops 610 and 620 also reset to a logical low when their CDN inputs are at a logical low due to reset bar node rstb going to a logical low. In this specific embodiment, flip-flops 610 and 620 are reset when a chip containing limiter circuit 600 is first powered on. In another embodiment, node rstb can be tied high so flip-flops 610 and 620 never get reset. Also, in yet another embodiment, flip-flops 610, 620, and 650 can have no reset option. Whether flip-flops 610, 620, and 650 have reset options will depend on the application or logic requirements. Also, the use of such reset options if used will also depend on the application or logic requirements.

Figure 7:
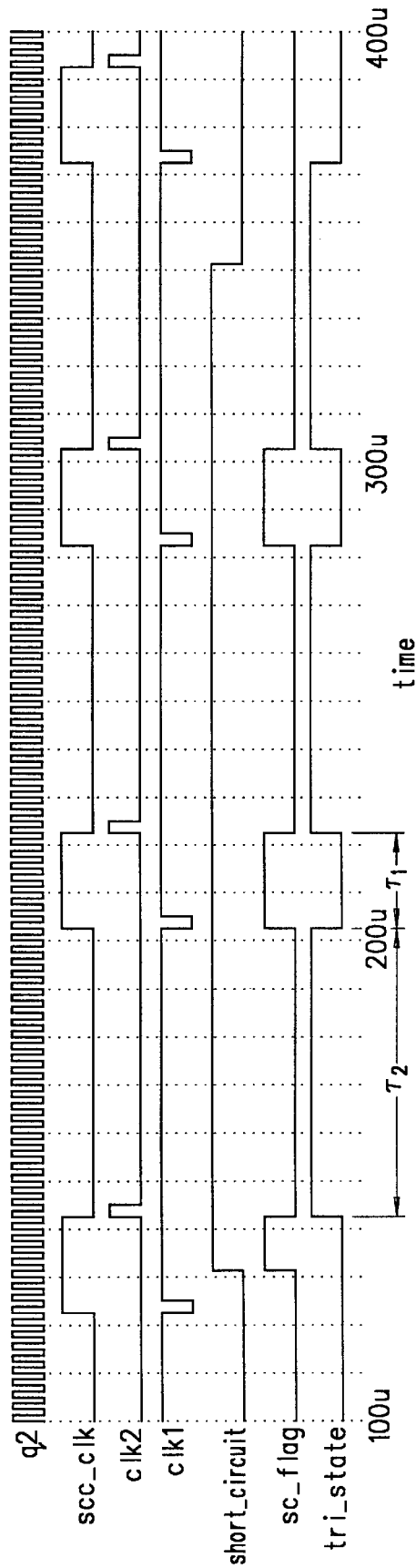
FIG. 7 shows a timing diagram illustrating the operation of a short circuit power limiter phase selector, according to the present invention.

FIG. 7 shows a timing diagram illustrating the operation of a short circuit power limiter phase selector, according to the present invention. Again, signal scc_clk is high for $\tau_1$ seconds and low for $\tau_2$ seconds. Signals clk1 and clk2 are asserted low and high on the rising and falling edges of signal scc_clk, respectively. Clock signals clk1 and clk2 are narrow pulse signals having the width of one period of signal q2.

If a short circuit is detected (sc_flag is high) at the falling edge of scc_clk (end of $\tau_1$), the short circuit power limiter sends a tri-state signal to the amplifier for a duration of $\tau_2$ seconds. Referring to FIG. 7, initially, when the short circuit occurs (signal short_circuit goes high), the tri-state node is still low. The amplifier will thus still be on during the short and the output current will exceed $I_{lim}$. Stated mathematically, when signal short_circuit=1 and signal tri-state=0, $I_o>I_{lim}$. When $I_o>I_{lim}$, signal sc_flag goes high. If signal sc_flag is high at the rising edge of clk2 then signal tri-state will go high. When signal tri_state goes high, the amplifier gets turned off. Even though there is still a short, the amplifier output will be zero. With $(I_o=0)<I_{lim}$, signal sc_flag will go low even though the short still exists (signal short_circuit=1).

At the beginning of period $\tau_1$, signal clk2 goes low. This resets the tri-state signal to zero and the amplifier gets turned on again. If the short circuit still exists, $I_o$ will exceed $I_{lim}$ again. This will set signal sc_flag high and the whole process repeats.

Specifically, when a short circuit condition exists and signal clk2 is asserted, the tri-state signal goes high. This thus tri-states the output transistors for the duration of $\tau_2$ seconds. The output transistors are automatically turned on again at the rising edge of signal scc_clk for a duration of $\tau_1$ seconds. When signal clk1 is asserted, the tri-state signal goes low regardless of other signal conditions. The cycling of the output transistors repeats continuously if the short persists. If no short circuit is sensed, sc_flag does not go high and thus the output transistors do not get tri-stated.

In conclusion, it can be seen that the present invention provides numerous advantages. Principally, it eliminates problems and limitations resulting from short circuit conditions. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. A short circuit power limiter circuit comprising:
   a current sensor configured to detect short circuit conditions in a target circuit and to send the short circuit flag signal during short circuit conditions; and
   a power limiter having an input terminal for receiving the short circuit flag signal from the current sensor, the power limiter being configured to limit the power consumption of the target circuit as long as a short circuit condition exists, wherein the power limiter limits the power consumption of the target circuit by repeatedly toggling at least one transistor in the target circuit on and off as long as the short circuit condition exists.

2. The limiter circuit of claim 1, wherein the at least one transistor is part of an output buffer.

3. The limiter circuit of claim 1 wherein the power limiter is configured to send a tri-state signal to the target circuit in response to the short circuit flag signal during short circuit conditions, and further configured to assert the tri-state signal for a duration of $\tau_2$ seconds, the limiter circuit disabling at least one transistor in the target circuit for a duration of $\tau_2$ seconds and enabling the at least one transistor for a duration of $\tau_1$ seconds, repeating such a cycle as long as a short circuit condition exists.

4. The limiter circuit of claim 3 wherein the tri-state signal is asserted for a duration of $\tau_2$ seconds which is greater than an unasserted duration of $\tau_1$ seconds.

5. The limiter circuit of claim 1 wherein the power limiter receives the short circuit flag signal from the output of an amplifier and sends a tri-state signal to the amplifier.

6. The limiter circuit of claim 1 wherein the target circuit is an amplifier.

7. A short circuit power limiter circuit comprising:
   a current sensor configured to detect short circuit conditions in a target circuit and to send the short circuit flag signal during short circuit conditions;
   a power limiter having an input terminal for receiving the short circuit flag signal from the current sensor, the power limiter being configured to limit the power consumption of the target circuit as long as a short circuit condition exists; and
   a counter configured to generate the tri-state signal.

8. The limiter circuit of claim 7 wherein the counter comprises a plurality of registers coupled in series and a final register configured to receive output signals from two registers of the plurality of registers.

9. The limiter circuit of claim 8 wherein at least one register is a D-type flip-flop.

10. A short circuit power limiter circuit comprising:
    a current sensor configured to detect short circuit conditions in a target circuit and to send the short circuit flag signal during short circuit conditions;
    a register configured to receive the short circuit flag signal from the current sensor and to send a tri-state signal to at least one transistor in the target circuit in response to the short circuit flag signal during short circuit conditions;

a counter configured to produce a clock signal with an asserted state of at least 10 times the duration of an unasserted state; and a logic circuit coupled between the counter and the register, for controlling the register to produce the tri-state signal during the asserted state while the short circuit flag signal is asserted.

11. The limiter circuit of claim 10 wherein the tri-state signal when asserted is at a logical low for a duration of $\tau_1$ seconds and to a logical high for a duration of $\tau_2$ seconds.

12. The limiter circuit of claim 10 further comprising a plurality of registers coupled in series and a final register configured to receive output signals from two registers of the plurality of registers.

13. The limiter circuit of claim 12 wherein at least one register is a D-type flip-flop.

14. A method for short circuit power limiting comprising:

sensing output current from a target circuit;

detecting short circuit conditions of the output current; and limiting the power consumed by the target circuit as long as the short circuit conditions are detected by repeatedly toggling at least one output transistor of the target circuit on and off as long as a short circuit condition exists.

15. The method of claim 14 further comprising:

receiving a short circuit flag signal from a current sensor coupled to at least one transistor in a target circuit;

generating a tri-state signal for a duration of $\tau_2$ seconds;

sending the tri-state signal to the at least one transistor in response to the short circuit flag signal during short circuit conditions; and disabling, in response to the tri-state signal, at least one transistor in the target circuit for a duration of $\tau_2$ seconds and enabling the at least one transistor for a duration of $\tau_1$ seconds, repeating this cycle as long as a short circuit condition exists.

16. The method of claim 15 wherein the tri-state signal is asserted for a duration of $\tau_2$ seconds which is greater than an unasserted duration of $\tau_1$ seconds.

17. A short circuit power limiter circuit comprising:

a current sensor configured to detect short circuit conditions in a target circuit, the current sensor being configured to couple to at least one transistor in the target circuit;

a first register configured to receive a short circuit flag signal from the current sensor, the current sensor configured to send the short circuit flag signal during short circuit conditions, the first register further being configured to send a tri-state signal to at least one transistor in the target circuit in response to the short circuit flag signal during short circuit conditions;

a second register; and a third register, the second register being configured to receive an input signal and coupled in series to a third register, an output of second register being coupled to an input the third register and to a first input of a first NAND gate, a complimentary output of the second register being coupled to a first input of a second NAND gate, an output of the third register being coupled to a second input of the second NAND gate, and a complimentary output of the third register being coupled to a second input of the first NAND gate, the first NAND gate being coupled to an input of the first register, the second NAND gate being coupled to a clock input of the first register via an inverter, and a counter comprising a plurality of divider registers coupled in series and a final register configured to receive output signals from two registers of the plurality of divider registers, the counter generating the tri-state signal, the tri-state signal being at a logical low for a duration of $\tau_1$ seconds and to a logical high for a duration of $\tau_2$ seconds, the power limiter circuit disabling at least one transistor in the target circuit for a duration of $\tau_2$ seconds and enabling the at least one transistor for a duration of $\tau_1$ seconds, repeating this cycle as long as a short circuit condition exists.

* * * * *